United States Patent
Lin et al.

(10) Patent No.: US 11,476,100 B1
(45) Date of Patent: Oct. 18, 2022

(54) SHIELDING MECHANISM AND SUBSTRATE-PROCESSING CHAMBER WITH THE SAME

(71) Applicant: SKY TECH INC., Hsinchu County (TW)

(72) Inventors: Jing-Cheng Lin, Hsinchu County (TW); Ta-Hao Kuo, Hsinchu County (TW); Yu-Te Shen, Hsinchu County (TW); Chi-Hung Cheng, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 0 days.

(21) Appl. No.: 17/409,602

(22) Filed: Aug. 23, 2021

(30) Foreign Application Priority Data

May 17, 2021 (TW) .................................. 110117770

(51) Int. Cl.
*H01J 37/34* (2006.01)
*C23C 14/34* (2006.01)

(52) U.S. Cl.
CPC .......... *H01J 37/3441* (2013.01); *C23C 14/34* (2013.01)

(58) Field of Classification Search
CPC ........... H01H 37/3447; H01H 37/3441; H01H 37/32651; H01H 37/3288; H01H 37/32899; H01H 37/3488; H01J 37/3447; H01J 37/3441; H01J 37/32651; H01J 37/3288; H01J 37/32899; H01J 37/3488; C23C 14/34

USPC ....................................... 204/298.11, 298.25
See application file for complete search history.

(56) References Cited

U.S. PATENT DOCUMENTS

| | | | |
|---|---|---|---|
| 5,624,536 A * | 4/1997 | Wada .................. | H01J 37/3408 204/192.12 |
| 2002/0046945 A1* | 4/2002 | Hosokawa .............. | C23C 14/56 204/298.18 |
| 2022/0111513 A1* | 4/2022 | Muthukamatchi ....... | B25J 9/102 |

FOREIGN PATENT DOCUMENTS

WO    WO 95/21457    *   1/1995

* cited by examiner

*Primary Examiner* — Rodney G McDonald
(74) *Attorney, Agent, or Firm* — Chun-Ming Shih; Lanway IPR Services

(57) ABSTRACT

The present disclosure is a substrate-processing chamber with a shielding mechanism, which includes a reaction chamber, a substrate carrier, a storage chamber and a shielding mechanism. The reaction chamber is connected to the storage chamber, the substrate carrier is within the reaction chamber. The shielding mechanism includes at least one guide unit, at least one connecting seat, a shield and at least one drive arm. The drive arm is connected to the shield for driving the shield to move between the storage chamber and the reaction chamber. During a deposition process, the drive arm drives the shield to move into the storage space. During a cleaning process, the drive arm moves the shield to move into the reaction chamber for prevent pollution to the substrate carrier.

18 Claims, 8 Drawing Sheets

SHIELDING MECHANISM AND SUBSTRATE-PROCESSING CHAMBER WITH THE SAME

TECHNICAL FIELD

The present disclosure relates to a shielding mechanism and a substrate-processing chamber with the same, which mainly employs the shielding mechanism to isolate a reaction space of a reaction chamber from a substrate carrier, to prevent polluting the substrate carrier during a process of cleaning the reaction chamber.

BACKGROUND

Thin-film-deposition equipments, such as chemical-vapor deposition (CVD), physical-vapor deposition (PVD) and the atomic-layer deposition (ALD) equipments, those are commonly employed in manufacturing process of semiconductors, light-emitting diodes and displays, etc.

A thin-film-deposition equipment mainly includes a chamber and a substrate carrier, wherein the substrate carrier is within the chamber for carrying at least one substrate. To exemplify by PVD, a target material is required to dispose within the chamber, wherein the target material faces the substrate on the substrate carrier. When performing PVD, noble gas or reactive gas is transferred into the chamber, then bias electricity is applied on the target material and the substrate carrier respectively, also the substrate carried on by the substrate carrier is heated up.

The noble gas or reactive gas within the chamber transforms into ionized gas in effect of a high-voltage electric field, then the ionized gas is attracted by the bias electricity to bombard the target material. Thereby, atoms or molecules splashed from the target material are attracted by the bias electricity on the substrate carrier, then be deposited on surface of the substrate and forms a thin film on the surface of the substrate.

After some time of usage, an inner surface of the chamber may also be formed with thin film, then a periodic cleaning is required to perform to the chamber, in order to prevent the waste thin film from dropping onto the substrate and causing pollution during the process of thin-film deposition. Moreover, surface of the target material may be formed with oxide or other pollutant, therefore requires a periodic cleaning as well. Generally, a burn-in process is applied to bombard the target material within the chamber by plasma ions, then to remove the oxides or pollutants on the surface of target material.

To perform the abovementioned cleaning process, the substrate carrier and the substrate must be extracted or kept out, to prevent the removed pollutant from turning to pollute the substrate carrier and the substrate, during the cleaning process.

SUMMARY

Generally, after some time of usage, the substrate-processing chamber is required for cleaning, in order to remove the waste thin film within the chamber and the oxide or nitride on the target material. During the cleaning process, some removed pollutant particles may turn to pollute the substrate carrier, thus there is a need to keep out the substrate carrier from the removed pollutant. The present disclosure provides a shielding mechanism and a substrate-processing chamber with the same, which mainly employs a drive arm to drive a shield moving along with a guide unit and between a storage state and a shielding state, such that to prevent the removed pollutant particles from turning to pollute the substrate carrier during the process of cleaning the chamber or the target material.

An object of the present disclosure is to provide a substrate-processing chamber with a shielding mechanism, which mainly includes a reaction chamber, a substrate carrier, a storage chamber and the shielding mechanism, wherein the storage chamber is connected to the reaction chamber. The shielding mechanism includes a guide unit, a connecting seat, a shield and a drive arm, wherein the drive arm is connected to the shield or the connecting seat, such that to drive the shield or the connecting seat to move between the storage chamber and the reaction chamber.

During the process of cleaning the reaction chamber, the drive arm drives the shield to move into the reaction chamber and to cover the substrate carrier within the reaction space, for preventing the plasma or the removed pollutant from contacting the substrate carrier and/or the substrate carried on thereby. When performing a deposition process, the driving arm drives the shield to move into the storage chamber, and allows the reaction chamber to operate a thin-film deposition to the substrate.

An object of the present disclosure is to provide the abovementioned substrate-processing chamber, wherein the drive arm becomes two respectively connected to two sides of the shield. By virtue of the two guide units, the shield can be carried more steadily for a stable movement, also the shield can be formed with a greater thickness and a heavier mass. By virtue of the thicker and heavier shield, which is more durable against a deformation caused by the process of cleaning the chamber, and which can further prevent the plasma or the removed pollutant from sneaking through the deform shield and contacting the substrate carrier or the substrate.

Furthermore, two jacket members may be disposed to respectively jacket the two guide units, for preventing tiny particles from spreading into a containing space of the reaction chamber, wherein the tiny particles are created as the guide units drive the shield to move. Also, a distance between the two jacket members, which are all greater than a diameter of the substrate carrier and a diameter of the substrate thereon, such that to avoid interfering and disrupting a movement of the substrate carrier and the performance of the deposition process.

An object of the present disclosure is to provide the abovementioned substrate-processing chamber, wherein the drive arm may be foldable robotic arm which includes a first drive arm and a second drive arm. The first drive arm is connected to the second drive arm via a joint axle, wherein the first drive arm and the second drive arm drive the shield to move along the guide unit and move between the reaction chamber and the containing space. In different embodiments, the drive arm may also be a stretchable robotic arm or a robotic scissor arm, which can serve to move the shield as well.

To achieve the abovementioned objects, the present disclosure provides a substrate-processing chamber, which includes a reaction chamber, a substrate carrier, a storage chamber, a shielding mechanism. The reaction chamber includes a containing space. The substrate carrier is positioned within the containing space, for carrying at least one substrate. The storage chamber is connected to the reaction chamber, wherein the storage chamber comprises a storage space that is fluidly connected to the containing space. The shielding mechanism includes: at least one guide unit extending from the storage space to the containing space; at least one connecting seat connected to the guide unit; a shield connected to the connecting seat; and at least one drive arm connected to the shield or the connecting seat for driving the shield and the connecting seat to move along the guide unit and move between the storage space and the containing space. The shield moves in a direction parallel to an extending direction of the guide unit.

Another object of the present disclosure is to provide is a shielding mechanism adapted to a substrate-processing chamber, which includes: at least one guide unit; at least one connecting seat connected to the guide unit; a shield connected to the connecting seat; and at least one drive arm connected to the shield or the connecting seat for driving the shield to move along the guide unit. The shield moves in a direction parallel to an extending direction of the guide unit.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

Figure 1:
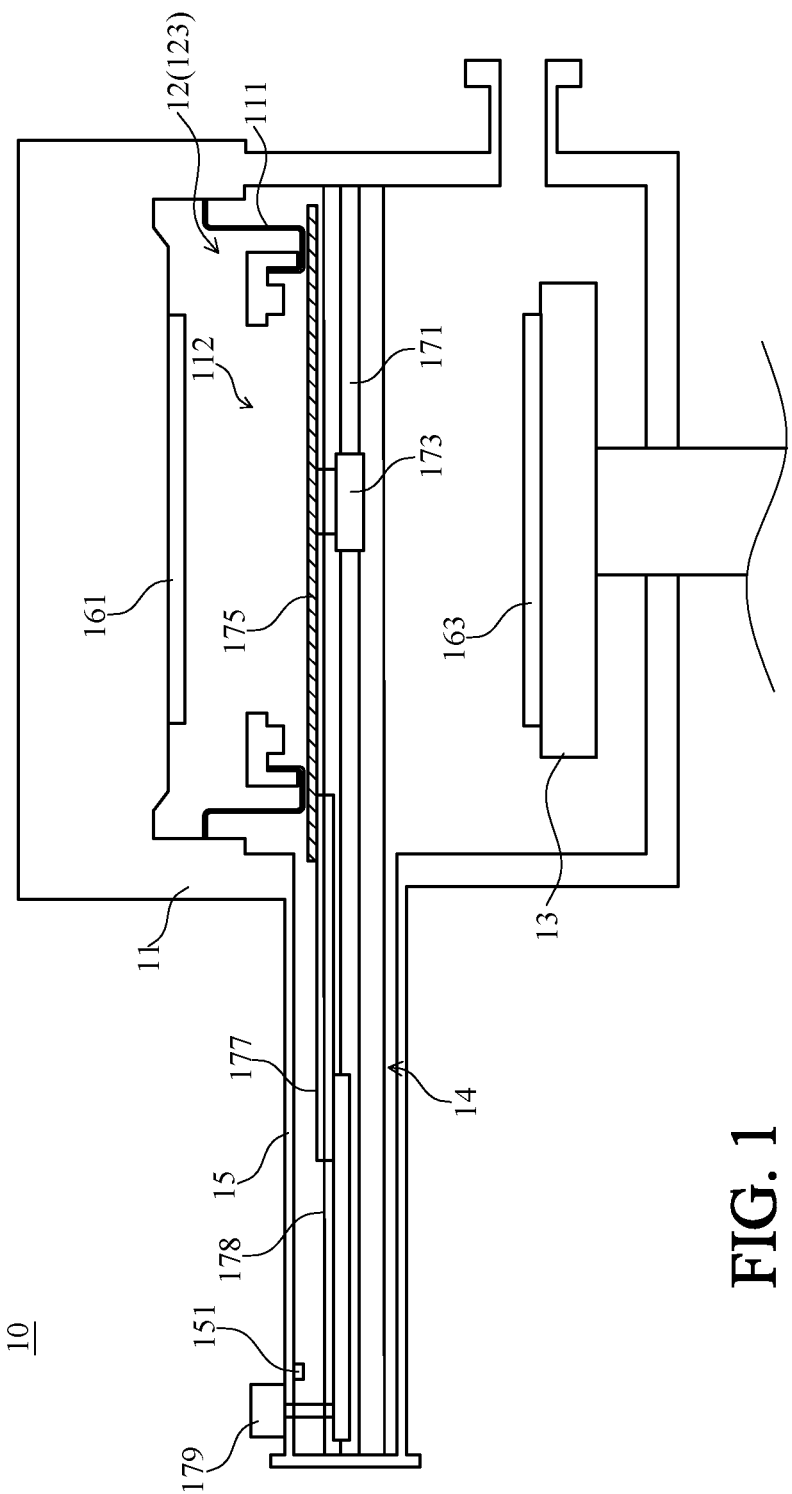
FIG. 1 is a schematic side sectional view illustrating a shielding state of a substrate-processing chamber, according to one embodiment of the present disclosure.
Figure 2:
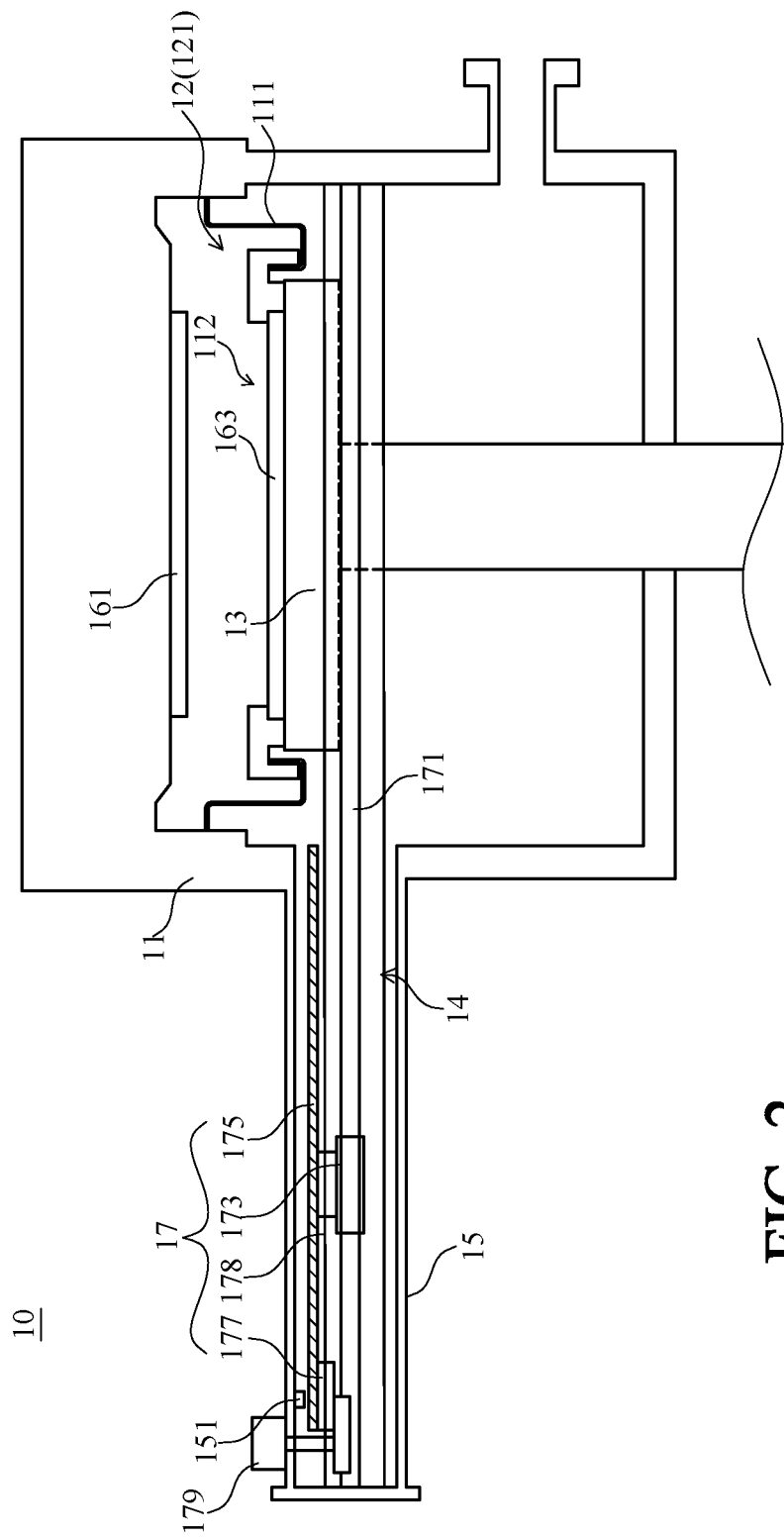
FIG. 2 is a schematic side sectional view illustrating a storage state of a substrate-processing chamber, according to one embodiment of the present disclosure.

Referring to FIG. 1 and FIG. 2, which are schematic side sectional views respectively illustrating a shielding state, and a storage state of a substrate-processing chamber 10, according to one embodiment of the present disclosure. As shown in FIGs, the substrate-processing chamber 10 mainly includes a reaction chamber 11, a substrate carrier 13, a storage chamber 15 and a shielding mechanism 17. The reaction chamber 11 is connected to the storage chamber 15, and the substrate carrier 13 is disposed within the reaction chamber 11.

The reaction chamber 11 has a containing space 12 for containing the substrate carrier 13. The storage chamber 15 is connected to the reaction chamber 11 and has a storage space 14, wherein the storage space 14 is fluidly connected to the containing space 12 for containing and storing the shield 175.

The substrate carrier 13 is positioned within the containing space 12 of the reaction chamber 11, for carrying at least one substrate 163. In this embodiment, the substrate-processing chamber 10 is exemplified as a physical-vapor-deposition (PVD) chamber, and as shown in FIG. 1 and FIG. 2, the reaction chamber 11 is disposed with a target material 161 therein, wherein the target material 161 faces the substrate 163 and the substrate carrier 13.

Figure 3:
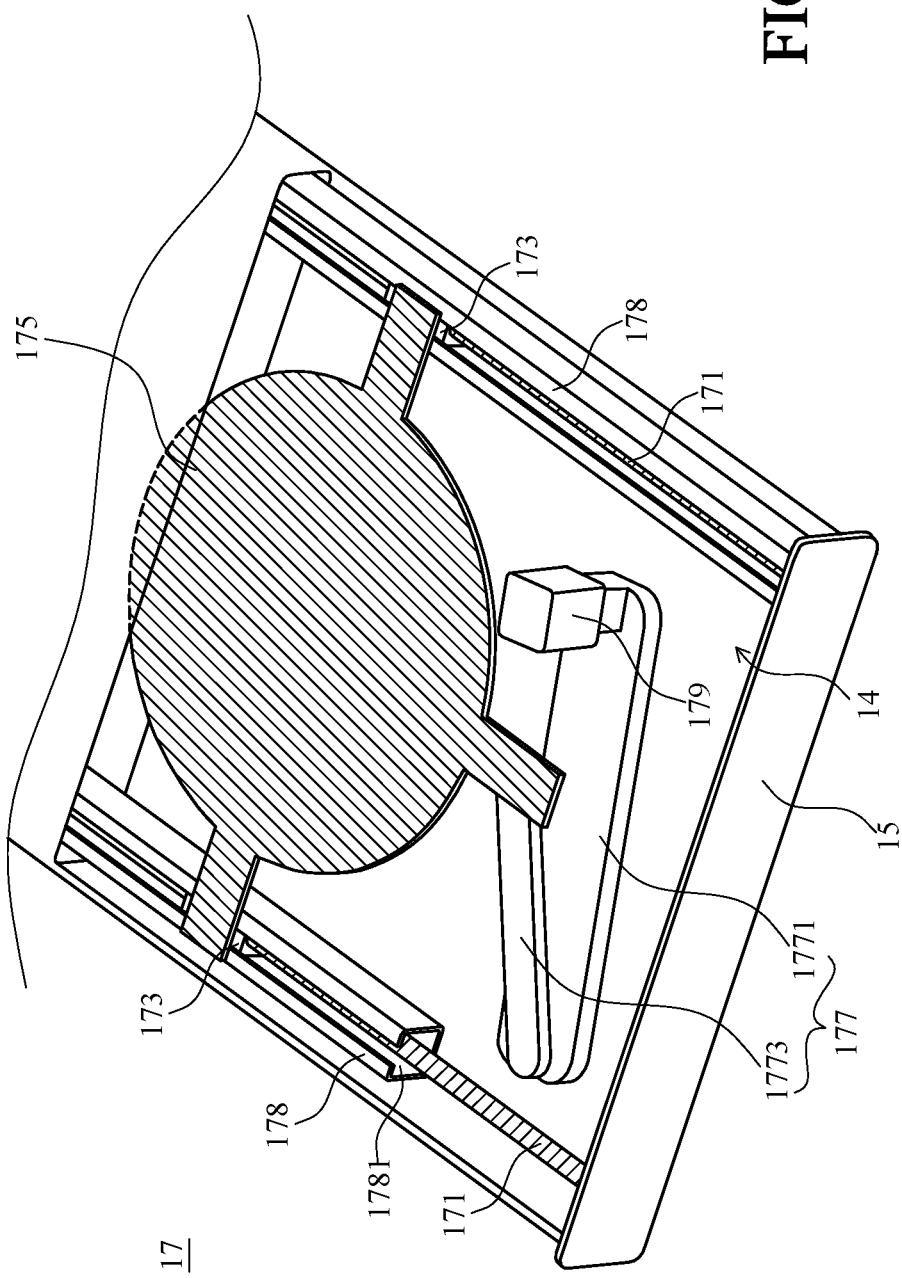
FIG. 3 is a schematic perspective internal view of a shielding mechanism of the substrate-processing chamber, according to one embodiment of the present disclosure.

Also referring to FIG. 3, the shielding mechanism 17 includes at least one guide unit 171, at least one connecting seat 173, a shield 175 and at least one drive arm 177. The connecting seat 173 interconnects the shield 175 and the guide unit 171. The drive arm 177 is connected to the shield 175 or the connecting seat 173, for driving the shield 175 and connecting seat 173 to move related to the guide unit 171, such as to drive the shield 175 and the connecting seat 173 to move along the guide unit 171 and move between the storage space 14 (FIG. 2) and the containing space 12 (FIG. 1).

In one embodiment according to the present disclosure, the guide unit 171 may be a shaft which extends from the storage space 14 of the storage chamber 15 to the containing space 12 of the reaction chamber 11. For example, in this embodiment, the storage chamber 15 has a wall surface (left side in FIG. 1) facing a wall surface of the reaction chamber 11 (right side in FIG. 2), and the guide unit 171 extends from the wall surface of the storage chamber 15 to the wall surface of the reaction chamber 11.

The connecting seat 173 is disposed on the guide unit 171, and movable along the guide unit 171. For example, the connecting seat 173 may include at least one through hole which allows the guide unit 171 to extend through, thereby the connecting seat 173 and the shield 175 move in a direction parallel to the guide unit 171. In a different embodiment, the guide unit 171 may be a slide rail, in the other hand, the connecting seat 173 is a slide block connected to the guide unit 171. However, the guide unit 171 as a shaft or slide rail, which is merely one of the embodiments, claim scope of the present disclosure should not be limited to.

In practical use, the drive arm 177 may be connected to a drive unit 179, and thereby the drive unit 179 drives the drive arm 177 to move the shield 175 along the guide unit 171, and to move between the storage space 14 and the containing space 12. The drive unit 177 may be such as a motor or a stepper motor, which is connected to the storage chamber 15 through a magnetic-liquid-rotary seal.

In one embodiment of the present disclosure, the drive arm 177 may include at least one first drive arm 1771 and at least one second drive arm 1773. For example, the drive arm 177 may be a foldable robotic arm, which includes a first drive arm 1771 and a second drive arm 1773. The first drive arm 1771 has one end connected to the drive unit 179, and another end connected to one end of the second drive arm 1773 via a joint axle or a rotary axle. In the other hand, the second drive arm 1773 further has another end connected to the shield 175 or a connecting seat 173, such that the drive unit 179 can drive the first drive arm 1771 and the second drive arm 1773 to move the shield 175 back and forth, by stretch out or fold back.

However, the drive arm 177 as foldable robotic arm with two drive arms 1771, 1773, which is merely one of the embodiments, the claim scope of the present disclosure should not be limited to. In other embodiments, the drive arm 177 may be a stretchable robotic arm or a robotic scissor arm, which can also serve to drive the shield 175 move along the guide unit 171 and between the storage space 14 and the containing space 12.

Figure 4:
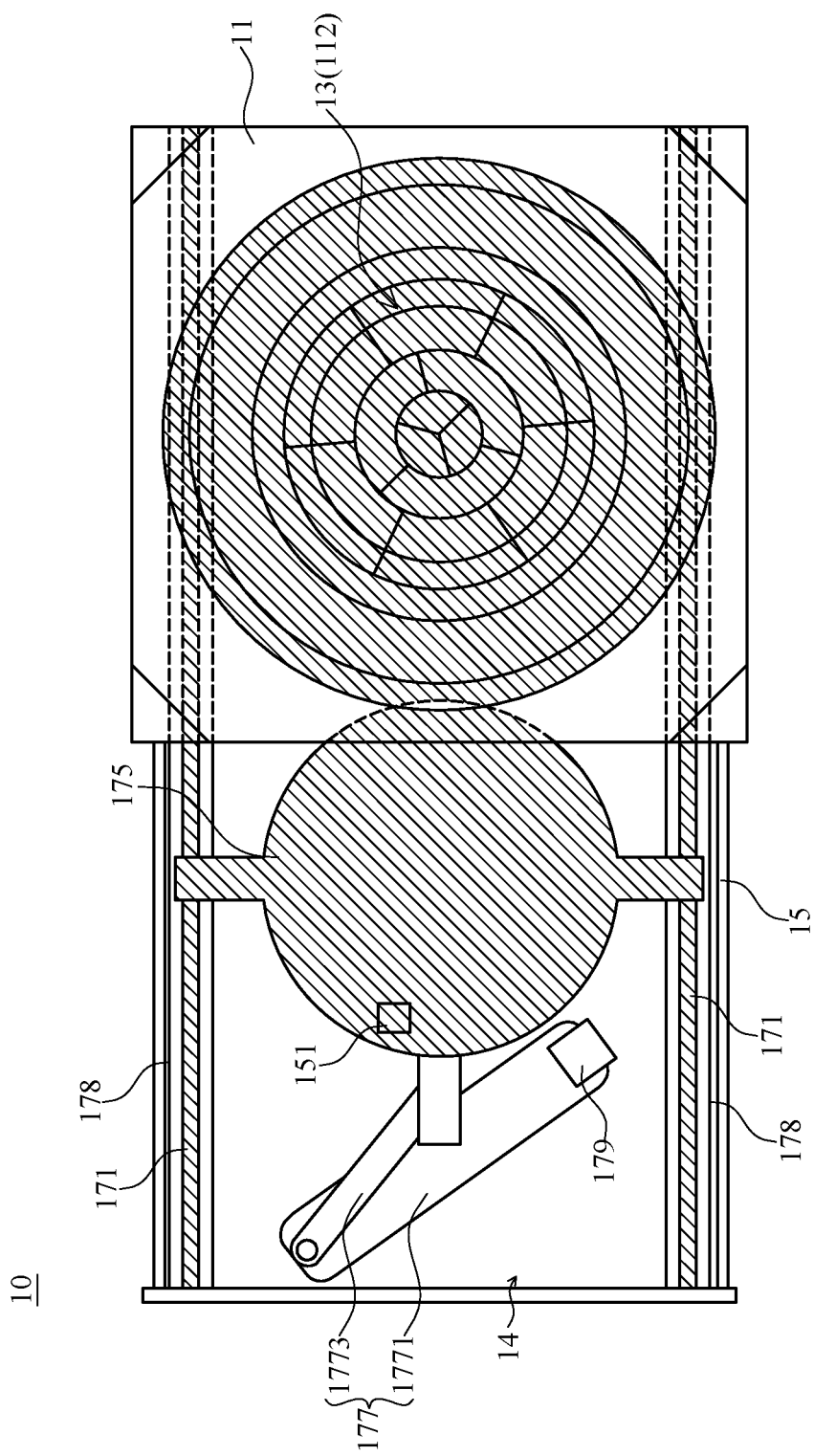
FIG. 4 is a schematic top internal view illustrating the storage state of the substrate-processing chamber, according to one embodiment of the present disclosure.
Figure 5:
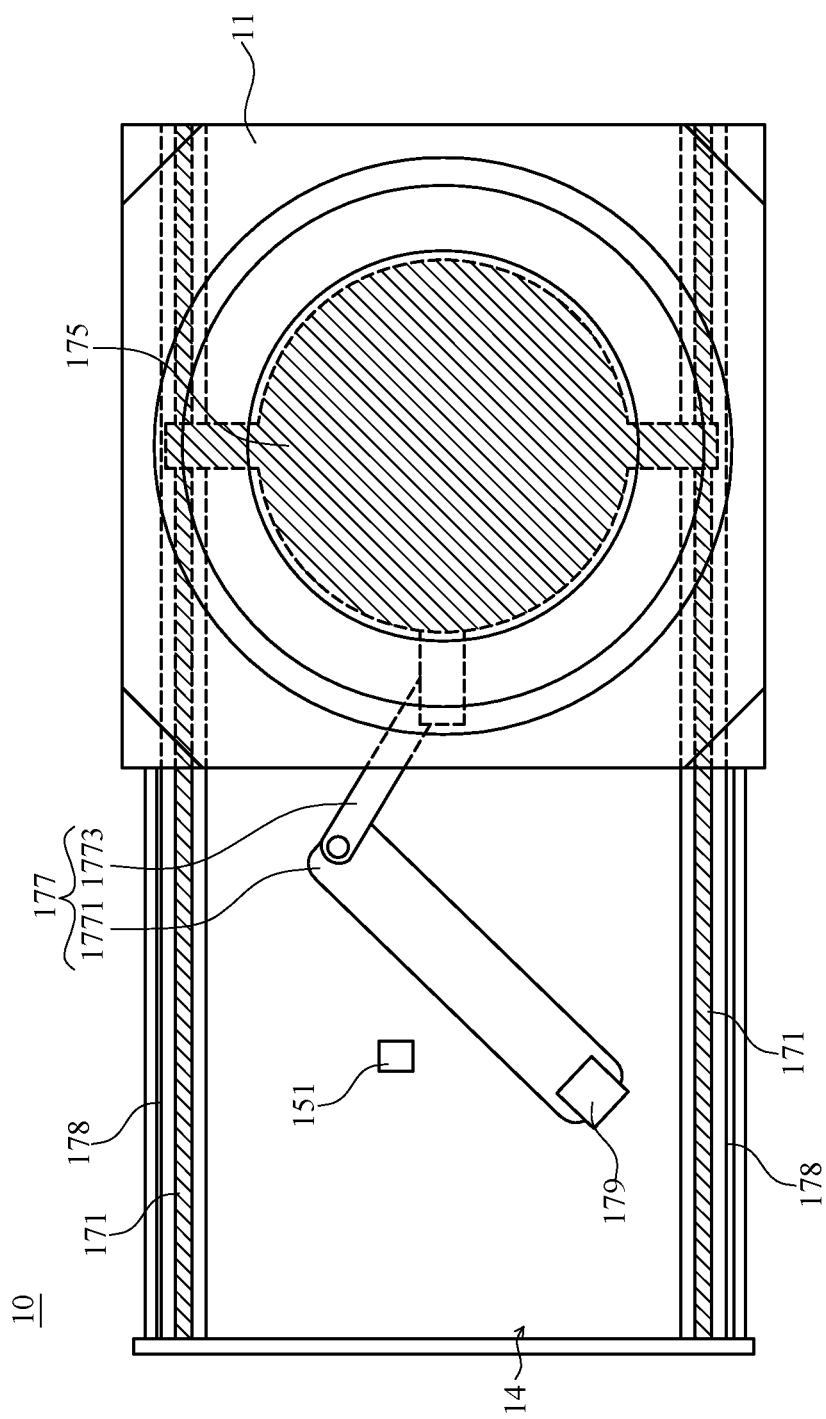
FIG. 5 is a schematic top internal view illustrating the shielding state of the substrate-processing chamber, according to one embodiment of the present disclosure.

As shown in FIG. 4 and FIG. 5, the substrate-processing chamber 10 according to the present disclosure is operable in two states, as a storage state and a shielding state. The drive arm 177 can drive the connecting seat 173 and the shield 175 to move along the guide unit 171, and to move into the storage space 14 of the storage chamber 15, such that the substrate-processing chamber 10 operates in the storage state. As shown in FIG. 2 and FIG. 4, the shield 175 does not get between the target material 161 and the substrate carrier 13 with the substrate 163 thereon.

Thereafter, the substrate carrier 13 and the substrate 163 thereon can be driven by an elevating unit (not shown) to move and approach the target material 161. Then, a process gas such as noble gas, which is disposed within the containing space 12 and controlled to bombard the target material 161, such that to perform a thin-film deposition on a surface of the substrate 163.

In one embodiment according to the present disclosure, the containing space 12 of the reaction chamber 11 may be disposed with a blocking member 111, wherein the blocking member 111 has an end connected to the reaction chamber 11 and another end formed with an opening 112. When the substrate carrier 13 is driven to approach the target material 161, the substrate carrier 13 also enters or contacts the opening 112 of blocking member 111, such that the reaction chamber 11, the substrate carrier 13 and the blocking member 111 together define a reacting space 121 within the containing space 12, thereby to prevent forming undesired thin film on other portions of the reaction chamber 11 and the substrate carrier 13 those are outside of the reacting space 121, during the thin-film deposition process.

Otherwise, the drive arm 177 may drive the connecting seat 173 and the shield 175 to move along the guide unit 171 into the containing space 12 of the reaction chamber 11, such that the substrate-processing chamber 10 operates in the shielding state, as shown in FIG. 1 and FIG. 5. Thereby, the shield 175 is positioned between the target material 161 and the substrate carrier 13 with the substrate 163, for isolating the target material 161 from the substrate 163 and substrate carrier 13.

The shield 175 in the shielding state can define a cleaning space 123 within the containing space 12, wherein the containing space 12 and the reacting space 121 may spatially overlap with reacting space 121 partially or entirely. The containing space 12 may perform a burn-in process therein, which applies plasma to bombard, clean the target material 161, a portion of the reaction chamber 11 and/or the blocking member 111 within the cleaning space 123, and to remove some oxide or pollutant on a surface of the target material 161, also to remove some undesired, waste thin film on surfaces of the reaction chamber 11 and/or the blocking member 111.

During a process of cleaning the substrate-processing chamber 10, the substrate carrier 13 and/or the substrate 163 is covered or kept away by the shield 175, to prevent the removed pollutant from turning to pollute or deposit on surface of the substrate carrier 13 and/or the substrate 163 thereon.

The shield 175 according to the present disclosure commonly has a plate-shaped appearance, such as a round plate but not limited thereto. The shield 175 has an area larger than that of the opening 112 formed on the blocking member 111 and/or the substrate carrier 13.

In one embodiment according to the present disclosure, the shielding mechanism 17 may include just one guide unit 171 and one connecting seat 173, wherein the guide unit 171 is connected to a side of the shield 175 via the connecting seat 173. Such that, the guide unit 171 does not spatially overlap with or interfere the opening 112 of the blocking member 111, the substrate 163 and/or the substrate carrier 13, in order to avoid disrupting the movement of the substrate carrier 13 and the thin-film deposition process.

In another embodiment according to the present disclosure, as shown in FIG. 3-FIG. 5, the shielding mechanism 17 may include may include two guide units 171 and two connecting seats 173, wherein the two guide units 171 are respectively connected to two sides of the shield 175 via the two connecting seats 173. Similar to the aforementioned embodiment, the two guide units 171 do not spatially overlap with or interfere the opening 112 of blocking member 111, the substrate 163 and/or the substrate carrier 13. To be specific, the two guide units 171 have a perpendicular distance therebetween, which is greater than maximum lengths (e.g. maximum diameters) of the opening 112 of the blocking member 111, the substrate 163 and/or the substrate carrier 13. Therefore, the guide units 171 do not disrupt the movement of the substrate carrier 13 and the thin film deposition process.

Specifically, when number of guide unit 171 and number of the connecting seat 173 are two or more, these can aid to carry and move the shield 175 in a more stable manner. Besides, by virtue of employing two the guide units 171 and two connecting seats 173, these can also facilitate carrying a thicker or heavier shield 175. The thicker and heavier shield 175 can resist thermal deformation caused by the burn-in cleaning process of the substrate-processing chamber 10, and thereby to prevent the shield 175 from deforming and allowing some of the plasma to sneak through, then to contact the substrate carrier 13 or the substrate 163 below.

Figure 6:
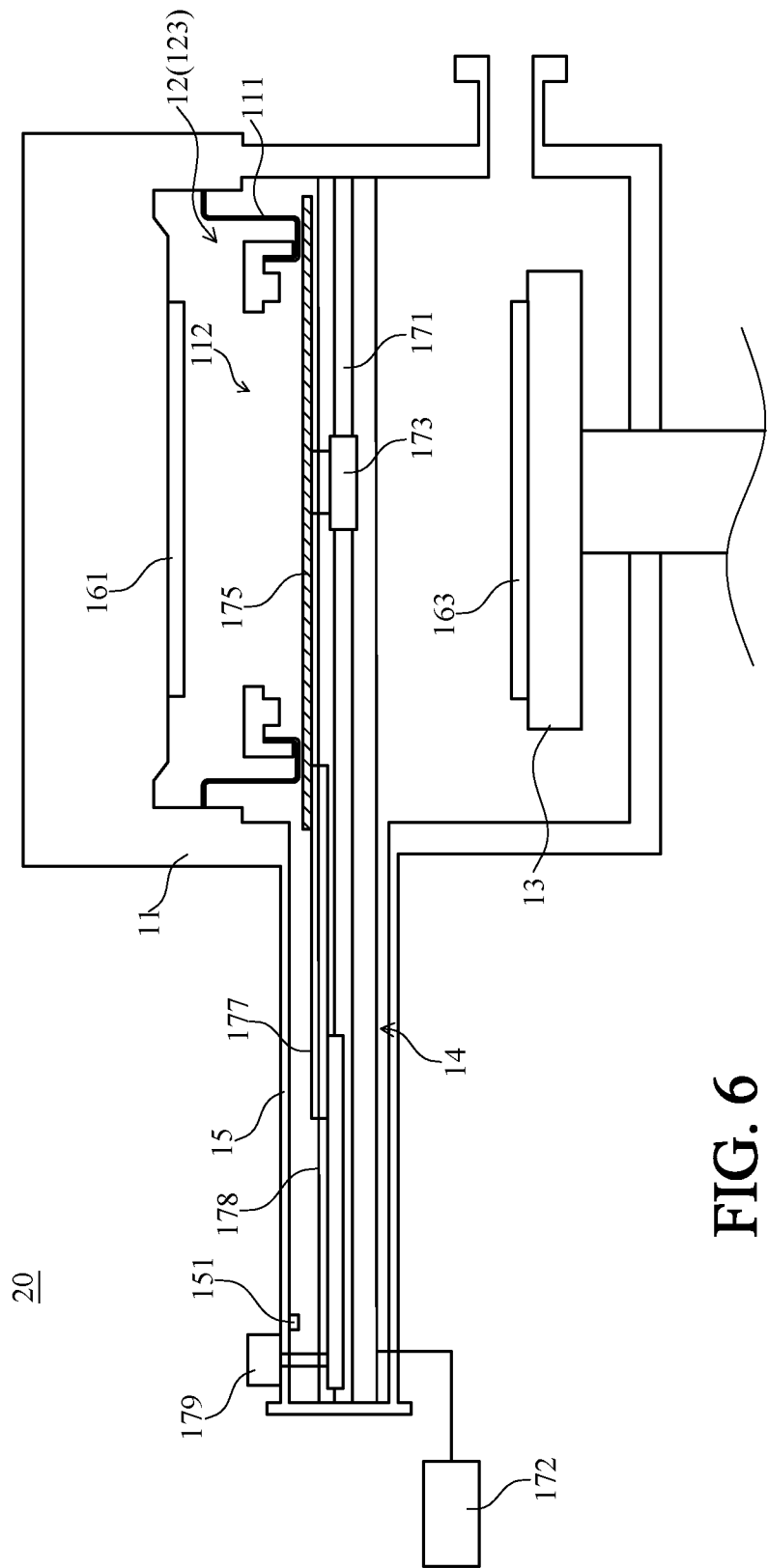
FIG. 6 is a schematic side sectional view illustrating the shielding state of the substrate-processing chamber, according to another embodiment of the present disclosure.
Figure 7:
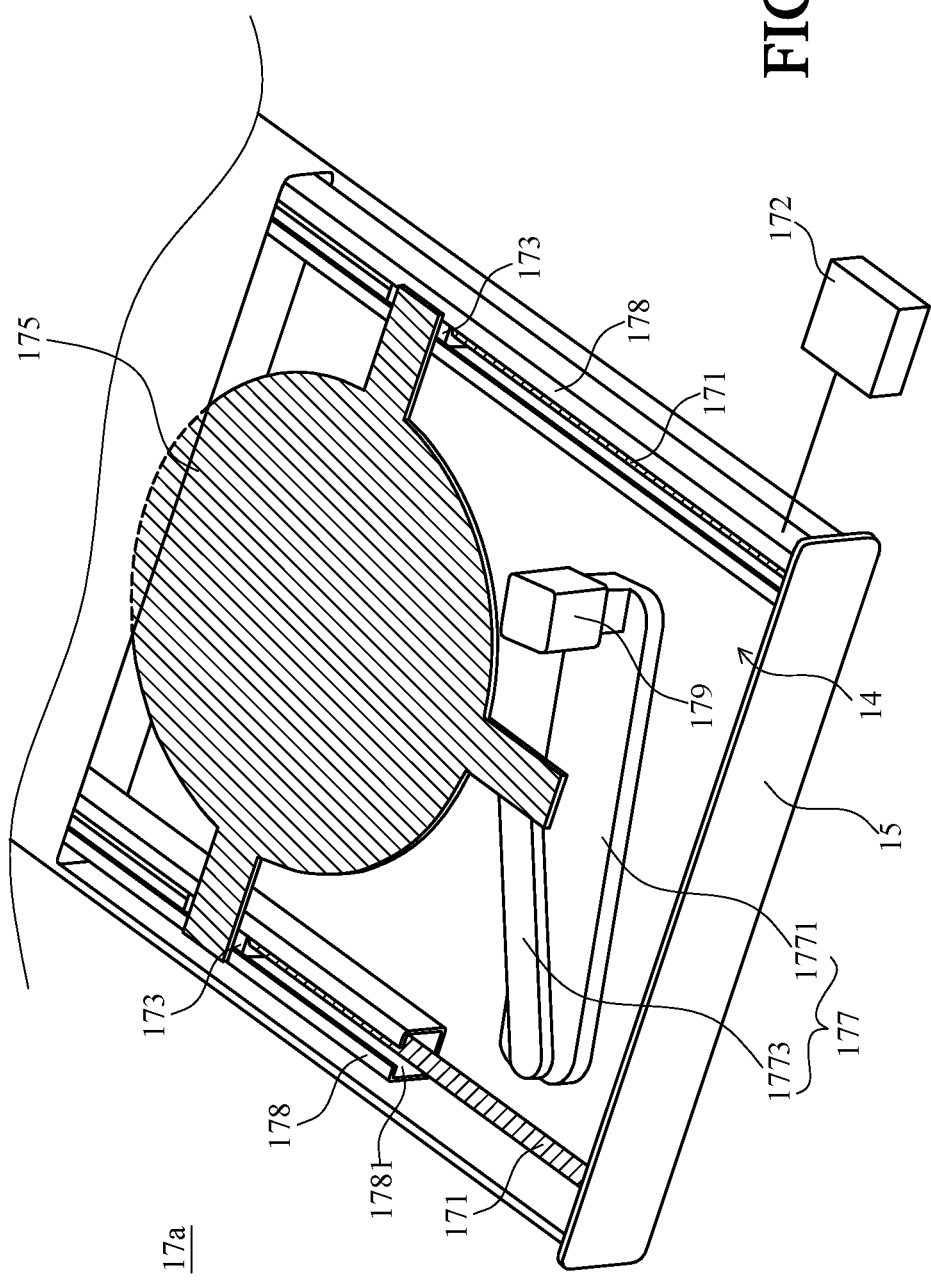
FIG. 7 is a schematic perspective internal view illustrating the storage state of the substrate-processing chamber, according to another embodiment of the present disclosure.

Referring to FIG. 6 and FIG. 7, which are respectively a schematic side sectional view illustrating the shielding state of the substrate-processing chamber 20, and a schematic perspective internal view illustrating the storage state of the substrate-processing chamber 20, according to another embodiment of the present disclosure. As shown in FIGs, the shielding mechanism 17a of the substrate-processing chamber 20 may include at least one jacket member 178 and a bias unit 172, wherein the jacket member 178 is positioned within the containing space 12 and the storage space 14, for jacketing the guide unit 171 and the connecting seat 173. Specifically, the jacket member 178 may have a long bar-like appearance, which extends from the wall surface of the storage chamber 15 to the opposite wall surface of the reaction chamber 11.

The jacket member 178 has an isolating space 1781, wherein the guide unit 171 and the connecting seat 173 are positioned within the isolating space 1781. By virtue of disposing the jacket member 178, when some tiny particles are created as the guide unit 171 drives the connecting seat 173 and the shield 175 move (such as by friction between components), the jacket member 178 can prevent the tiny particles from falling and spreading into the containing space 12 and/or the storage space 14, thereby to maintain cleanliness of the containing space 12 within the reaction chamber 11. The jacket member 178 may be formed with a U-shaped cross-section view and also have a top portion disposed with a long gap, thereby the connecting seat 173 moves along the gap.

In one embodiment according to the present disclosure, the jacket member 178 may be made of electrical conductor, such as metal, etc. The jacket member 178 is electrically connected to a bias unit 172, wherein the bias unit 172 is for generating a bias electricity on the jacket member 178. Optionally, the bias unit 172 may provide a direct-current bias electricity, or an alternating-current bias electricity. To specific, as the connecting seat 173 moves along the guide unit 171, tiny particles may be created by the friction therebetween, wherein those tiny particles by friction are usually electrified. Therefore, by virtue of the jacket member 178 which is formed with the bias electricity thereon, this can attract, collect and the electrified tiny particles within the isolating space 1781 of the jacket member 178, such that to prevent the tiny particles from spreading into the containing space 12 of the reaction chamber 11.

Figure 8:
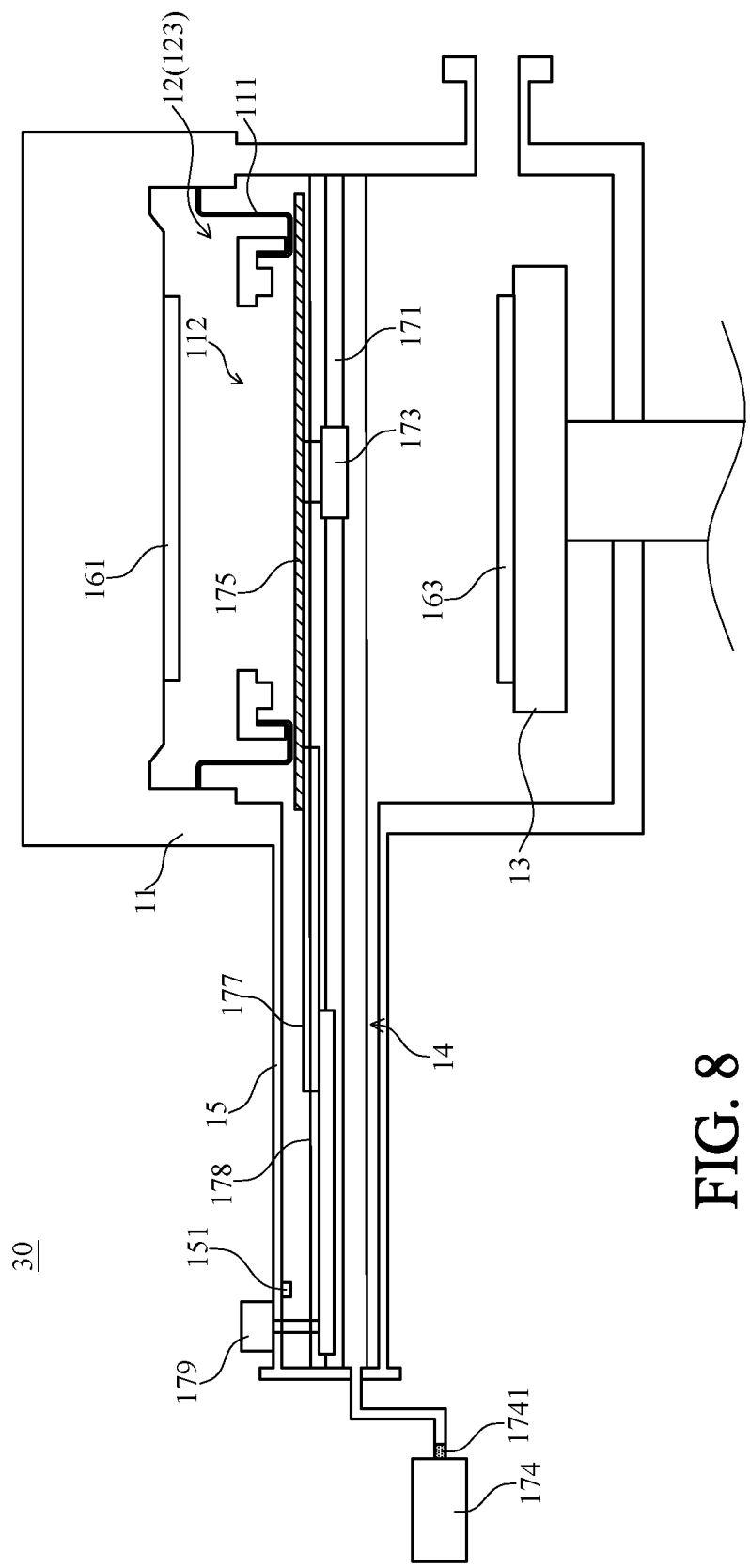
FIG. 8 is a schematic side sectional view of the substrate-processing chamber, according to another different embodiment of the present disclosure.

In another embodiment according to the present disclosure as shown in FIG. 8, the substrate-processing chamber 30 may be disposed with at least one suction unit 174, which is fluidly connected to the isolating space 1781 of the jacket member 178. The suction unit 174 is for extracting air or gas within the isolating space 1781 of the jacket member 178 by creating an air or gas pressure less than that of the containing space 12 of the reaction chamber 11, such that to keep those tiny particles from spreading out of the isolating space 1781 then into the containing space 12. In addition, the suction unit 174 may be configured to create a relatively stronger air or gas pressure enough to extract those undesired tiny particles out of the isolating space 1781, moreover with a filter unit disposed between the suction unit 174 and the isolating space 1781, such that the suction unit 174 can extract out those tiny particles, then the filter unit 1741 can collect and filtrate those extracted tiny particles.

In one embodiment according to the present disclosure, the storage chamber 15 may be further disposed with at least one position-sensor unit 151. The position-sensor unit 151 is disposed to face the storage space 14, for detecting if the shield 175 entered the storage space 14 or not. The position-sensor unit 151 may be an optical position sensor, for example.

If the substrate carrier 13 moves toward the target material 161 when the shield 175 is still within the containing space 12 of the reaction chamber 11, the substrate carrier 13 may hit the shield 175 then cause damage the substrate carrier 13 itself and/or the shield 175. In practical use, the substrate-processing chamber 10 may be configured as to permit the substrate carrier 13 to move and approach the target material 161, only when the position-sensor unit 151 detects and confirms that the shield 175 has entered the storage chamber 15 entirely, such that to avoid a collision between the substrate carrier 13 and the shield 175.

In another embodiment according to the present disclosure, the reaction chamber 11 may be disposed with the position-sensor unit 151, which faces the containing space 12 of the reaction chamber 11, for detecting if the shield 175 is still within the containing space 12. To be specific, the position-sensor unit 151 may be disposed to detect and confirm if the shield 175 has entirely entered the storage chamber 15 and/or moved out of the reaction chamber 11, it is only sufficient for the position-sensor unit 151 to detect a position of the shield 175, therefore a disposing manner or type of the position-sensor unit 151 should not limit claim scope of the present disclosure.

The above disclosure is only the preferred embodiment of the present disclosure, and not used for limiting the scope of the present disclosure. All equivalent variations and modifications on the basis of shapes, structures, features and spirits described in claims of the present disclosure should be included in the claims of the present disclosure.

We claim:

1. The substrate-processing chamber, comprising:
   a reaction chamber comprising a containing space;
   a substrate carrier positioned within the containing space for carrying at least one substrate;
   a storage chamber connected to the reaction chamber, wherein the storage chamber comprises a storage space that is fluidly connected to the containing space; and
   a shielding mechanism comprising
      at least one guide unit that extends from the storage space to the containing space,
      at least one connecting seat that is connected to the at least one guide unit,
      a shield that is connected to the at least one connecting seat,
      at least one drive arm that is connected to the at least one connecting seat or the shield, for driving the at least one connecting seat and the shield to move along the at least one guide unit and move between the storage space and the containing space, wherein the shield moves in a direction parallel to the at least one guide unit, and
      at least one jacket member that is positioned within both of the containing space and the storage space, and that comprises an isolating space, wherein the at least one guide unit and the at least one connecting seat are positioned within the isolating space of the at least one jacket member.

2. The substrate-processing chamber according to claim 1, wherein the at least one drive arm comprises at least one first drive arm and at least one second drive arm, and the first drive arm is connected to the shield via the second drive arm.

3. The substrate-processing chamber according to claim 2, further comprising a drive unit connected to the at least one first drive arm, wherein the drive unit drives the shield to move between the storage space and the containing space via the at least one first drive arm and the at least one second drive arm.

4. The substrate-processing chamber according to claim 3, wherein the drive unit is disposed on the storage chamber through a magnetic-liquid-rotary seal, and wherein the drive unit drives the at least one first drive arm and the at least one second drive arm to move the shield.

5. The substrate-processing chamber according to claim 1, wherein the at least one connecting seat are two, and the at least one guide unit are two connected to the shield via the two connecting seats respectively.

6. The substrate-processing chamber according to claim 1, wherein the storage chamber or the reaction chamber is disposed with at least one position-sensor unit, for detecting a position of the shield.

7. The substrate-processing chamber according to claim 1, further comprising a target material that is disposed within the containing space and that faces the substrate carrier, wherein the shield moving to the containing space is positioned between the target material and the substrate carrier.

8. The substrate-processing chamber according to claim 1, wherein the at least one jacket member is made of an electrical conductor and is electrically connected to a bias unit, and the bias unit generates a bias electricity on the at least one jacket member.

9. The substrate-processing chamber according to claim 1, further comprising at least one suction unit that is fluidly connected to the isolating space of the at least one jacket member, for extracting a gas within the isolating space.

10. The substrate-processing chamber according to claim 9, further comprising a filter unit positioned between the at least one suction unit and the isolating space of the at least one jacket member, wherein the at least one suction unit extracts the gas through the filter unit.

11. A shielding mechanism adapted to a substrate-processing chamber comprising:
   at least one guide unit;
   at least one connecting seat that is connected to the at least one guide unit;
   a shield that is connected to the at least one connecting seat;
   at least one drive arm that is connected to the at least one connecting seat or the shield, for driving the shield to move along the at least one guide unit, wherein the shield moves in a direction parallel to the at least one guide unit; and
   at least one jacket member that comprises an isolating space, wherein the at least one guide unit and the at least one connecting seat are positioned within the isolating space of the at least one jacket member.

12. The shielding mechanism according to claim 11, wherein the at least one drive arm comprises at least one first drive arm and at least one second drive arm, wherein the at least one first drive arm is connected to the shield via the at least one second drive arm.

13. The shielding mechanism according to claim 12, further comprising a drive unit connected to the at least one first drive arm, wherein the drive unit drives the at least one first drive arm and the at least one second drive arm to move the shield along the at least one guide unit.

14. The shielding mechanism according to claim 13, wherein the drive unit is a motor or a stepper motor.

15. The shielding mechanism according to claim 11, wherein the at least one connecting seat are two, and the at least one guide unit are two connected to the shield via the two connecting seats respectively.

16. The shielding mechanism according to claim 11, wherein the at least one jacket member is made of an electrical conductor and is electrically connected to a bias unit, and the bias unit generates a bias electricity on the at least one jacket member.

17. The shielding mechanism according to claim 11, further comprising at least one suction unit that is fluidly connected to the isolating space of the at least one jacket member, for extracting a gas within the isolating space.

18. The shielding mechanism according to claim 17, further comprising a filter unit positioned between the at least one suction unit and the isolating space of the at least one jacket member, wherein the at least one suction unit extracts the gas through the filter unit.

\* \* \* \* \*